(12) United States Patent
Underbrink et al.

(10) Patent No.: US 6,933,876 B1
(45) Date of Patent: Aug. 23, 2005

(54) PIPELINED ANALOG TO DIGITAL CONVERTER

(75) Inventors: Paul A. Underbrink, Lake Forest, CA (US); Kelly H. Hale, Aliso Viejo, CA (US); Guang-Ming Yin, Foothill Ranch, CA (US); Patrick D. Ryan, Yorba Linda, CA (US); Joseph H. Colles, Bonsall, CA (US); Daryush Shamlou, Laguna Niguel, CA (US)

(73) Assignee: Skyworks Solutions, Inc., Newport Beach, CA (US)

( * ) Notice: Subject to any disclaimer, the term of this patent is extended or adjusted under 35 U.S.C. 154(b) by 626 days.

(21) Appl. No.: 10/104,381

(22) Filed: Mar. 22, 2002

Related U.S. Application Data

(62) Division of application No. 09/410,205, filed on Sep. 30, 1999, now Pat. No. 6,532,370.

(51) Int. Cl.[7] ............................................. H03M 1/44
(52) U.S. Cl. ................................................. 341/162
(58) Field of Search ............................... 341/161, 162, 341/163

(56) References Cited

U.S. PATENT DOCUMENTS

| | | | |
|---|---|---|---|
| 5,629,700 A | 5/1997 | Kumamoto et al. | 341/161 |
| 5,914,991 A | 6/1999 | Gigandet et al. | 375/355 |
| 5,915,214 A | 6/1999 | Reece et al. | 455/406 |
| 5,923,668 A | 7/1999 | Lysejko | 370/515 |
| 5,940,452 A | 8/1999 | Rich | 375/347 |
| 6,028,546 A | 2/2000 | Signell et al. | 341/161 |
| 6,031,869 A | 2/2000 | Priebe et al. | 375/224 |
| 6,035,213 A | 3/2000 | Tokuda et al. | 455/553 |
| 6,134,430 A | 10/2000 | Younis et al. | 455/340 |
| 6,138,010 A | 10/2000 | Rabe et al. | 455/426 |
| 6,141,353 A | 10/2000 | Li | 370/465 |
| 6,340,944 B1 * | 1/2002 | Chang et al. | 341/161 |
| 6,381,265 B1 | 4/2002 | Hessel et al. | 375/219 |
| 6,686,860 B2 * | 2/2004 | Gulati et al. | 341/155 |
| 6,686,957 B1 * | 2/2004 | Johnson et al. | 348/222.1 |
| 6,700,524 B2 * | 3/2004 | Naka et al. | 341/161 |

FOREIGN PATENT DOCUMENTS

JP    2004214905 A  *  7/2004  ............ H03M/1/44

* cited by examiner

*Primary Examiner*—Howard Williams
(74) *Attorney, Agent, or Firm*—Christopher J. Rourk; Godwin Gruber LLP

(57) ABSTRACT

A cell phone is provided that may be used with multiple radio formats, such as GSM and CDMA. The cell phone includes a receiver that receives radio signals and converts them into electrical signals. An analog to digital converter is connected to the receiver and converts an analog input to a digital output having an adjustable number of bits at an adjustable sampling frequency. A cell phone application specific integrated circuit is connected to the analog to digital converter, which is used to process the digital output to extract encoded telecommunications data in one of the supported radio formats.

20 Claims, 3 Drawing Sheets

PIPELINED ANALOG TO DIGITAL CONVERTER

This application is a division of Ser. No. 09/410,205 filed Sep. 30, 1999 now U.S. Pat. No. 6,532,370.

FIELD OF THE INVENTION

The present invention relates generally to cellular communications and more particularly to a cellular handset with an adjustable analog to digital converter that allows the cellular handset to process wireless communications in two or more formats.

BACKGROUND OF THE INVENTION

Cellular wireless communications are well known in the art. Many different standards and formats have been developed and implemented for enabling cellular wireless communications between cellular base stations and cellular handsets. For example, the advanced mobile phone service format ("AMPS") was an initial analog format that was used to transmit data between a cellular base station and a cellular handset. The Global System for Mobile Communications ("GSM") format is a digital format that uses a combination of time division multiple access ("TDMA") and frequency division multiple access ("FDMA") coding to transmit encoded data between a cellular base station and a cellular handset. Code division multiple access ("CDMA") systems have also gained widespread acceptance for encoding data for transmission between a cellular base station and a cellular handset.

The large number of code and transmission formats that may be used for cellular communications has resulted in a number of different circuits that may be used to provide communication services from a cellular handset. Thus, cellular handsets are not interchangeable, and must be designed for use with one of the standardized formats for cellular data encoding and decoding. Although multi-rate phones are known in the art, such multi-rate phones suffer from various drawbacks. For example, one common drawback for multi-rate phones is that the multi-rate circuitry typically comprises redundant dual circuitry, such that both circuitries are active even though only one circuitry may be used at any given time. This configuration results in excess power consumption. Likewise, because dual sets of circuitry are used, it is necessary to construct the handset with hardware that will be idle and standing by for an unknown amount of use. This design constraint also results in a limit on the number of formats that can be processed by a given dual mode phone. For example, a dual mode phone typically would not be designed to be compatible with more than two common code and transmission formats, as this would result in a significant amount of excess equipment that would be idle at any given time.

SUMMARY OF THE INVENTION

Therefore, a cellular handset is required that can be adapted for use with multiple standard formats without requiring excess energy or excess equipment costs.

A cell phone is provided that may be used with multiple radio formats, such as GSM and CDMA. The cell phone includes a receiver that receives radio signals and converts them into electrical signals. An analog to digital converter is connected to the receiver and converts an analog input to a digital output having an adjustable number of bits at an adjustable sampling frequency. A cell phone application specific integrated circuit is connected to the analog to digital converter, which is used to process the digital output to extract encoded telecommunications data in one of the supported radio formats.

The present invention provides many important technical advantages. One important technical advantage of the present invention is an analog to digital converter that allows the sampling frequency and bit size of the sample to be adjusted in accordance with known standard formats for cellular communications. For example, the sampling frequency and bit size of samples of the present invention may be adjusted to allow processing of data and the GSM, CDMA, and other known and useful standard formats. Thus, the present invention allows a single set of cellular circuitry to perform processing of data in two or more standardized formats without requiring separate sets of the circuitry that are designed for each format to be contained within a single handset.

Another important technical advantage of the present invention is an adjustable analog to digital converter that may be readily adjusted to provide different sampling frequencies and sample bit sizes. The analog to digital converter of the present invention may include polarity of cells, where the number of cells may be adjusted as required. The cells of the analog to digital converter of the present invention may also be turned off when not being used, thus optimizing power usage by the analog to digital converter.

DETAILED DESCRIPTION OF PREFERRED EMBODIMENTS

Figure 1:
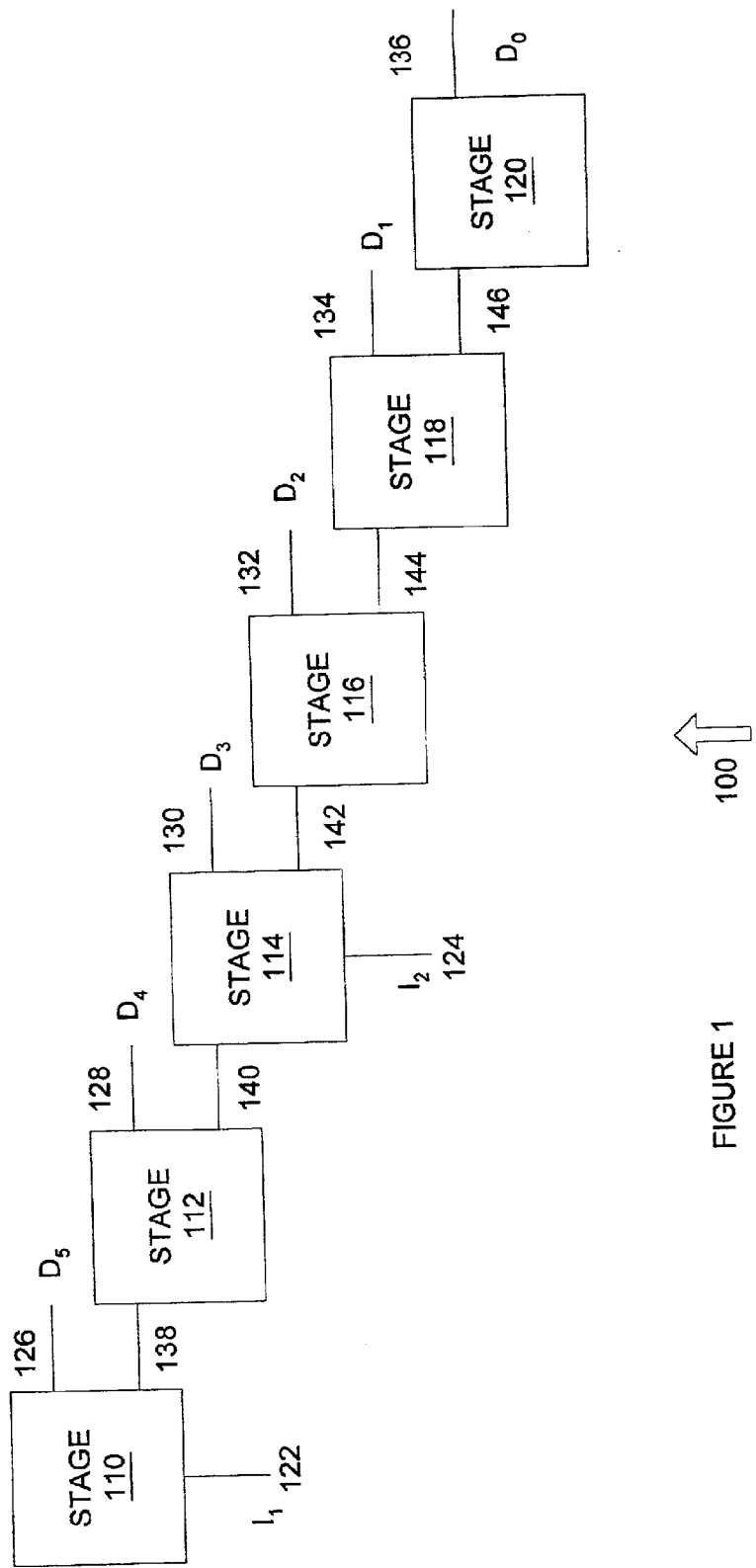
FIG. 1 is a diagram of an analog to digital converter in accordance with an exemplary embodiment of the present invention.

In the description which follows, like parts are marked throughout the specification and drawing with the same reference numerals, respectively. The drawing figures may not be to scale and certain components may be shown in generalized or schematic form and identified by commercial designations in the interest of clarity and conciseness.

FIG. 1 is a diagram of an analog to digital converter 100 in accordance with an exemplary embodiment of the present invention. Analog to digital converter 100 may be used to provide an adjustable sampling frequency and sample bit size in accordance with known standards for wireless communications.

Analog to digital converter 100 includes six cells 110, 112, 114, 116, 118 and 120. Each cell 110 through 120 is operable to receive an incoming voltage value and to output a logical zero or one depending upon the magnitude of the voltage applied at the input to the cell 110 through 120. For example, for a 6-cell analog to digital converter, the output of the first cell may generate a logical "1" if the magnitude of the applied voltage is equal to or greater than $33/64$ of the maximum voltage. If the voltage may vary between 0.0 volts and 63.0 volts, then the first cell may be designed to generate a logical "1" output when the applied voltage is equal to or greater than 32. The output that is applied to the next cell is then adjusted to equal the applied input minus the test magnitude. In the present example, if a voltage having a magnitude of 32.0 is applied to the input to cell 110, then the value of 0.0 volts would be applied to each successive cell, resulting in successive logical outputs of "0."

Each cell has an input, an output, and a signal feed to the next serial cell. In one exemplary embodiment, cell 110 includes input 122 (which is also one of the inputs to the analog to digital converter 100), output 126, and lead 138. Lead 138 also forms the input to cell 112, which has outputs 128 and lead 140. Lead 140 is coupled to secondary input 124 and also forms the input to cell 114. Outputs 130, 132, and 134 and serial connectors/inputs 142, 144, and 146 are associated in a similar manner with cells 114, 116, 118, and 120, respectively. Cell 120 has an output 136, but does not include a serial lead to a next cell.

In one exemplary embodiment, each of the cells of analog to digital converter 100 is different from each other cell in regards to the current rating of the cell. For example, cell 110 may be configured to handle higher current throughput than cell 112. Likewise, cell 112 may be configured to handle higher current throughput than cell 114. Current throughput for each succeeding cell may likewise be configured to have decreasing ratings, such that each cell consumes less power, and operates more effectively at lower current outputs or throughputs.

In operation, a sample voltage is applied to an input 122 or 124 of analog to digital converter 100. For example, if the sample voltage is applied to input 122, then analog to digital converter 100 processes this sample voltage and generates a 6-bit figure that correlates to the magnitude of the sample voltage. Generating this 6-bit figure will require 6 clock cycles, as each of the cells 110 through 120 of analog to digital converter 100 will generate an output at the end of a clock cycle. Thus, the signal provided to input 122 will result in a digital output (a "1" or a "0") one cycle later. In addition, a voltage magnitude will be output that at the end of that clock cycle that is applied to the next cell, cell 112.

In contrast, applying a sample to input 124 will result in a sample value in only 4 clock cycles. This sample value, from cells 114, 116, 118, and 120, will only have a 4-bit value. While input 124 may be used to yield a value in shorter time, the resolution of the sample is not as great as the resolution of the sample when a signal is provided to input 122.

For example, if the voltage may vary from 0.0 volts to 63.0 volts, and a voltage having the value of 60.0 volts is applied to input 122, then the corresponding value of the outputs 126 through 136 will be binary "111100," which corresponds to a decimal value of 60. This indicates that the value applied to input 122 is $^{61}/_{64}$ or 95.31 percent of the absolute magnitude from the minimum to the maximum value measurable. In this example, the converted value is exactly equal to the sampled value.

In contrast, if the same value is applied to input 124, then it will be necessary to first scale the input, such as through a resistive bridge. Thus, the applied voltage must be reduced to 25 percent of the voltage that may be applied to input 122, or 15.0 volts. The output at outputs 130 through 136 will be binary "1111," which corresponds to 16 on a 4-bit scale. Thus, even though the applied voltage is 15.0 volts out of a maximum of 15.75 volts, the sampled output value is equal to $^{16}/_{16}$ or 100 percent of the absolute magnitude from the minimum to the maximum value measurable, which results in an error of 6.25 percent. In this example, the output has a lower accuracy or resolution, but the output is generated at a higher speed.

The analog to digital converter 100 may be advantageously applied in cellular communication circuits that are configured for use with two or more standard formats. For example, a commonly used code division multiple access ("CDMA") format requires 8000 samples per second with a 5-bit sample size. In comparison, a commonly used GSM sampling frequency is 8000 samples per second with a 13-bit sample size. Thus, the GSM sample frequency, though equal to the CDMA sample frequency, requires a higher resolution. Analog to digital converter 100 may therefore be used to generate the required number of samples with either a 5-bit sample size or a 13-bit sample size, by adding seven additional cells and increasing the clock frequency of each cell to 104,000 hertz. In this example, the CDMA sampling may be accomplished by discarding samples from the GSM sampling, by value averaging samples to provide a more accurate estimate of the sample values, or by other suitable methods.

Figure 2:
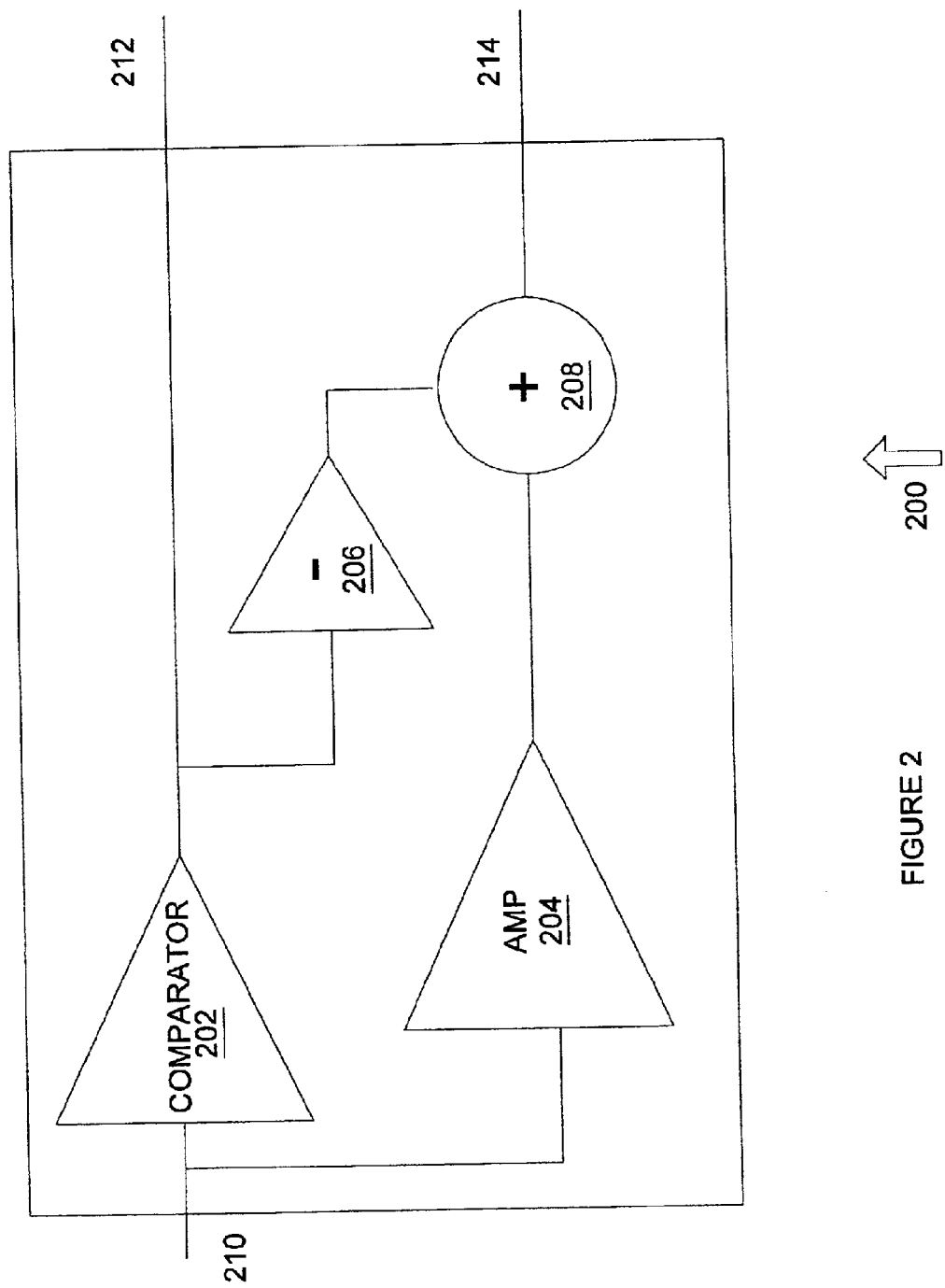
FIG. 2 is a diagram of a cell for use in an analog to digital converter in accordance with an exemplary embodiment of the present invention.

FIG. 2 is a diagram of a cell 200 for use in an analog to digital converter in accordance with an exemplary embodiment of the present invention. Cell 200 may be used to implement analog to digital converter 100.

Cell 200 includes comparator 202, which is coupled to amplifier 204 at its input and to subtractor 206 at its output. The output from amplifier 204 and subtractor 206 is fed into adder 208. The output from adder 208 is coupled to output 214. Comparator 202 receives an input from sample input 210 and outputs the value to logical output 212. Comparator 202 is operable to generate an output of logical "1" at logical output 212 when the input applied to sample input 210 is equal to or greater than a predetermined value. For example, if cell 200 is the most-significant bit in a six-bit analog to digital converter, with a maximum expected sample voltage of 63.0 volts and a minimum expected sample voltage of 0.0 volts, then the predetermined value for comparator 202 would be 32.

Amplifier 204, subtractor 206, and adder 208 then generate a sample value at output 214 that equals the value applied to sample input 210 minus the test value of comparator 202, if the comparator 202 output is logical "1," and the value applied to sample input 210 if the comparator 202 output is logical "0." Thus, in the previously described example, if the voltage applied to sample input 210 was 31.0 volts, the magnitude of the voltage at sample output 214 would be 31.0 volts. If the magnitude of the voltage at sample input 210 was 33.0 volts, then the magnitude of the voltage at sample output 214 would be 1.0 volts.

Comparator 202 and amplifier 204 are configured to handle current at progressively decreasing ratings. For example, if cell 200 is used in the first or lowest significant bit position of the analog to digital converter 100, then the current reading for amplifier 204 and comparator 202 and outer 208 will be higher then the current reading would be used if cell 200 was used in the least significant bit location of a comparator analog to digital converter 100. In this manner, the power loss for each cell 200 may be minimized in accordance with the service requirements for that particular cell in the pipelined digital to analog converter.

Comparator 202 and amplifier 204 may also be configured to switch off when no input is applied at sample input 210. This configuration may be used advantageously in an analog to digital converter in which the number of cell stages is adjustable. Thus, if cell 200 has been by-passed in order to provide samples having less than the maximum number of bits, then cell 200 will not also be consuming power, which will result in lower power consumption and extended battery life.

In operation, a sample voltage is applied to sample input 210 of cell 200, and an output is generated at logical output 212 and sample output 214. The logical output equals "1" if the sample voltage exceeds a predetermined value, and equals "0" if the sample voltage is less than a predetermined value. Likewise, the sample output equals the sample input minus the predetermined value if the sample input exceeds the predetermined value, and the sample output equals the sample input if the sample input is less than the predetermined value. The current rating for comparator 202 and amplifier 204 is based upon the number of stages that follow cell 200, such that a higher current rating is used if a large number of cells follow, and a lower current rating is use if a small number of cells follow. In this manner, the power consumption for each cell is optimized, based upon the number of cells that follow.

Figure 3:
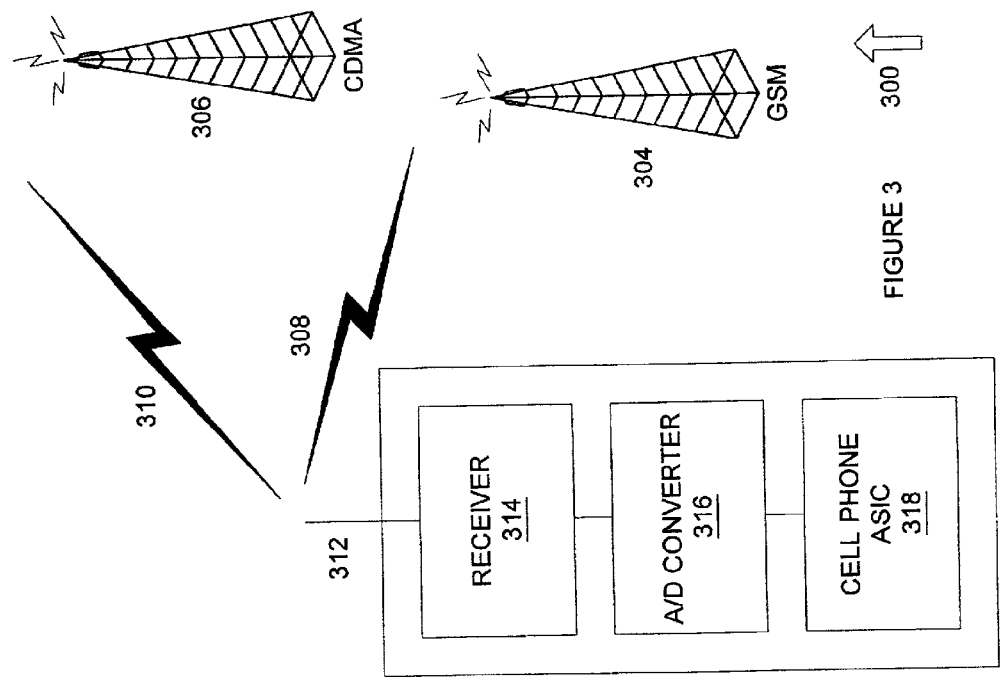
FIG. 3 is a diagram of a cellular system in accordance with an exemplary embodiment of the present inventions.

FIG. 3 is a diagram of a cellular system 300 in accordance with an exemplary embodiment of the present inventions. Cellular system 300 may be used to provide multi-format communications between a cellular handset and two or more cellular base stations.

Cellular system 300 includes cellular handset 302. Cellular handset 302 includes a configurable analog to digital converter, and is operable to receive CDMA communications from base station 306 and GSM communications from base station 304. Base station 304 broadcasts and receives electromagnetic radiation carrying data encoded in accordance with the GSM standard format over path 308, and base station 306 broadcasts and receives electromagnetic radiation carrying data encoded in accordance with a CDMA standard over path 310. The electromagnetic radiation broadcast over path 308 and path 310 is received by antenna 312. Receiver 314 converts the broadcast signals into transmitted signals by a suitable method, such as by shifting the frequency of the received signals or performing a frequency shifting function on the received broadcast signal. Receiver 314 may also amplify the signals received.

Receiver 314 is coupled to analog to digital converter 316. Analog to digital converter 316 is a configurable analog to digital converter that may be adjusted to generate analog to digital conversions at a pre-determined frequency and sample size. For example, analog to digital converter 316 may be operable to provide GSM samples at the GSM standardized sampling frequency and sample size, to provide CDMA samples at a CDMA standardized sampling frequency and sample size, or to provide samples at other suitable sampling frequencies and sizes.

Analog to digital converter 316 is coupled to cell phone application-specific integrated circuit 318. Cell phone application-specific integrated circuit 318 is operable to convert the digital data output by analog to digital converter 316 into speech data (such as data that might be recognizable by a human being), control data, and signaling data, such as data that would be recognizable as dial digits or a busy signal or other suitable data.

Cell phone application-specific integrated circuit 318 is also operable to adjust the conversion frequency and sample size of analog to digital converter 316. For example, cell phone application-specific integrated circuit 318 may analyze the output of analog to digital converter 316 to determine that analog to digital converter 315 is currently not converting new data in a suitable format.

Cell phone application-specific integrated circuit 318 may then adjust the conversion frequency and sample size of analog to digital converter 316 to ensure that cellular handset 302 is receiving the transmitting data in the required format. If cell phone application-specific integrated circuit 318 is unable to verify the format, it may adjust the conversion frequency and sample size of analog to digital converter 316 to the next most likely values.

In operation, cellular system 300 allows the user of handset 302 to use any suitable standardized or proprietary signaling format, such as CDMA or GSM standard signaling formats. Thus, if a user is currently in a cell in which only GSM standard signaling is available, and travels to a cell in which only CDMA standard signaling is available, then cellular system 300 may be used to provide continuous service to the user. Thus, cellular system 300 provides increased flexibility and configurability for both cellular communications system operators and the users of the cellular communications system.

Figure 4:
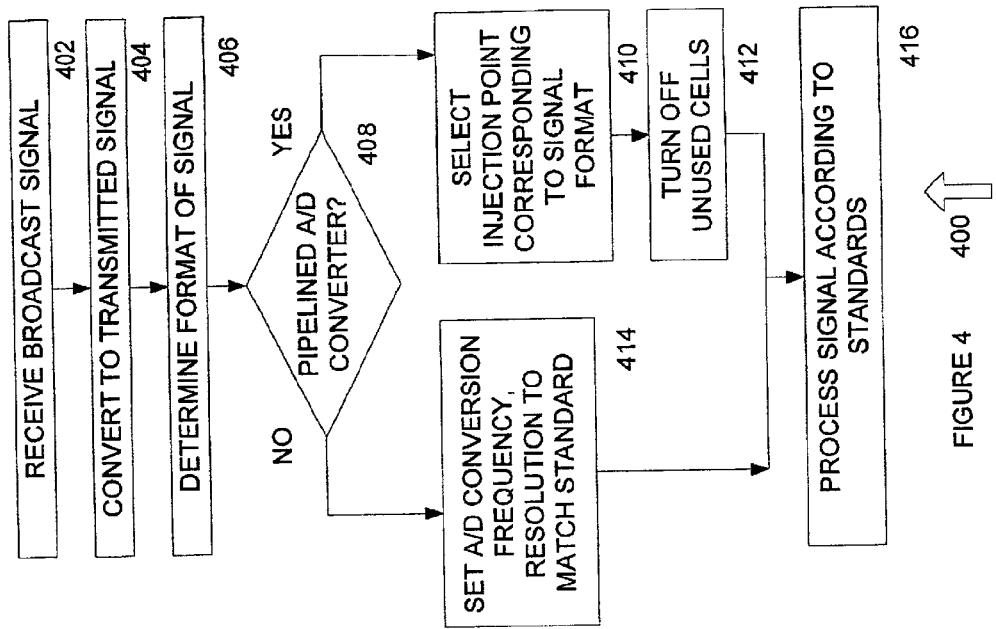
FIG. 4 is a flow chart of a method for processing cellular communications in accordance with an exemplary embodiment of the present invention.

FIG. 4 is a flow chart of a method 400 for processing cellular communications in accordance with an exemplary embodiment of the present invention. Method 400 may be used to adjust the analog to digital converter frequency of a cellular handset so that it may be used in a cellular system that includes two or more standard or proprietary radio formats.

Method 400 begins at step 402 where a broadcast signal is received. The broadcast signal will typically include electromagnetic radiation that has been encoded with data in a standardized or proprietary radio format. The method then proceeds to step 404 where the broadcast signal is converted to a transmitted signal, such as by a receiver of a cellular handset. The method then proceeds to step 406.

In step 406, the format of the signal is determined. For example, the cellular phone application-specific integrated circuit may convert a received signal using known standard or proprietary formats, which may require the adjustment of analog to digital conversion rates. Other suitable means may also be used, such as by transmitting standard signaling data that includes the radio format data for the cells provided cellular communications coverage to that service area. The method then proceeds to step 408. As step 408, it is determined whether a pipelined analog to digital converter is being used. If a pipelined analog to digital converter is being used, the method proceeds to step 410 where an injection point corresponding to the signal format is selected. For example, if the pipeline analog to digital converter includes 13 cell stages and the signal format being used only requires a 5-bit sample size, then only 5cells will be used. The method then proceeds to step 412.

At step 412, the unused analog to digital converter cells are turned off. For example, if the unused analog to digital converter cells consume a relatively large amount of power, allowing the cells to remain on will result in power losses without any corresponding increase in the quality of communications. The unused cells may be turned off automatically when a sample signal is not provided to them, in response to control commands from a cell phone application specific integrated circuit, or by other suitable systems or methods. The method then proceeds to step 416.

If it is determined that step 408 to a pipelined analog to digital converter is not being used, the method proceeds to step 414 where the analog to digital conversion frequency and resolution are set to match the standard. For example, the present invention may be used as other adjustable analog to digital conversion circuits such as those that use adjustable clock rates, adjustable voltage levels, adjustable filter components, or other suitable adjustable analog to digital conversion circuits. These circuits are adjusted in step 414 to match the analog to digital conversion frequency and sample size of the radio format being used for cellular communications. The method then proceeds to step 416.

At step 416, the received signal is processed according to the standardized signaling processing formats for the corresponding broadcast signal standard. For example, GSM signals will be processed as 13-bit samples at 8000 samples per second. Other suitable sample sizes and frequencies may be selected such as CDMA standards, AMP standards, or other suitable standards.

Although preferred and exemplary embodiments of a system for inspecting components that have been sealed in a packing material have been described in detail herein, those skilled in the art will also recognize that various substitutions and modifications may be made to the systems and methods without departing from the scope and spirit of the appended claims.

What is claimed is:

1. An analog to digital converter comprising:
   converter circuitry;
   a first input coupled to the converter circuitry;
   a second input coupled to the converter circuitry;
   an output coupled to the converter circuitry; and
   wherein an input signal applied to the first input is sampled at a first frequency and a first sample size, and wherein the input signal applied to the second input is sampled at a second frequency and a second sample size.

2. The analog to digital converter of claim 1 wherein the converter circuitry further comprises a plurality of cells, each cell coupled in series to at least one other cell, the first input coupled to a first cell, and the second input coupled to a second cell.

3. The analog to digital converter of claim 1 wherein the converter circuitry further comprises:
   a first cell having a first current rating;
   a second cell coupled in series to the first cell, the second cell having a second current rating, where the second current rating is less than the first current rating; and
   one or more additional cells, each additional cell coupled in series to a preceding cell, each additional having a current rating that is less than the current rating of the preceding cell.

4. The analog to digital converter of claim 2 wherein each cell further comprises:
   a comparator coupled to a cell input;
   an amplifier coupled to the cell input;
   a subtractor coupled to the output of the comparator; and
   an adder coupled to the output of the subtractor and the amplifier.

5. The analog to digital converter of claim 4 wherein the comparator for each cell compares the voltage received at the cell input to a predetermined value.

6. The analog to digital converter of claim 4 wherein the comparator for each cell compares the voltage received at the cell input to a predetermined value, and the predetermined value for each successive cell is less than the predetermined value for the preceeding cell.

7. The analog to digital converter of claim 4 wherein the comparator for each cell compares the voltage received at the cell input to a predetermined value, and the output of the comparator is a digital value of one if the voltage received at the cell input is greater than the predetermined value.

8. The analog to digital converter of claim 4 wherein the adder for each cell outputs the voltage received at the cell input if the voltage is less than a predetermined value, and outputs the difference between the voltage received at the cell input and the predetermined value if the voltage received at the cell input is equal to or greater than the predetermined value.

9. A method for converting a signal from analog to digital comprising:
   receiving a signal at a first input of an analog to digital converter;
   converting the signal to a digital format having a first number of bits;
   receiving the signal at a second input of the analog to digital converter; and
   converting the signal to a second digital format having a second number of bits,
   where the first number of bits is not equal to the second number of bits.

10. The method of claim 9 wherein receiving the signal at the first input of the analog to digital converter comprises receiving the signal at a first input of a pipelined analog to digital converter.

11. The method of claim 9 wherein converting the signal to the digital format having the first number of bits comprises converting the signal to the digital format having the first number of bits using a number of stages of the digital to analog converter equal to the number of bits.

12. The method of claim 9 wherein receiving the signal at the second input of the analog to digital converter comprises receiving the signal at a second input of a pipelined analog to digital converter.

13. The method of claim 9 wherein receiving the signal at the second input of the analog to digital converter comprises receiving the signal between a first stage and a second stage of an analog to digital converter.

14. The method of claim 9 wherein receiving the signal at the second input of the analog to digital converter further comprises turning off one or more stages of the analog to digital converter between the first input and the second input.

15. A pipelined analog to digital converter comprising:
   a first stage having a first input;
   a second stage having a second input; and
   a plurality of outputs wherein the number of outputs for a signal applied to the first stage is different from the number of outputs for the signal applied to the second input.

16. The pipelined analog to digital converter of claim 15 further comprising one or more stages coupled between the first stage and the second stage.

17. The pipelined analog to digital converter of claim 15 further comprising one or more stages coupled between the second stage and a least significant bit output.

18. The pipelined analog to digital converter of claim 15 wherein each stage further comprises:
   a comparator coupled to a stage input;
   an amplifier coupled to the stage input;
   a subtractor coupled to the output of the comparator; and
   an adder coupled to the output of the subtractor and the amplifier.

19. The pipelined analog to digital converter of claim 15 wherein each stage further comprises an output that is representative of either a digital one or a digital zero.

20. The pipelined analog to digital converter of claim 15 wherein each stage further comprises an output that is derived from the applied signal.

* * * * *

UNITED STATES PATENT AND TRADEMARK OFFICE
CERTIFICATE OF CORRECTION

PATENT NO. : 6,933,876 B1
DATED : August 23, 2005
INVENTOR(S) : Paul A. Underbrink et al.

It is certified that error appears in the above-identified patent and that said Letters Patent is hereby corrected as shown below:

Column 7,
Line 26, change "the input signal" to -- an input signal --.
Line 41, after "additional" insert -- cell --.
Line 49, change "the output;" to -- an output --.
Line 50, change "the output" to -- an output --.
Lines 53, 56, 61 and 66, change "the voltage" to -- a voltage --.

Column 8,
Line 45, change "input" to -- stage --.
Line 57, change "the input" to -- an input --.
Line 58, change "the output" to -- an output --.

Signed and Sealed this

Eighteenth Day of October, 2005

JON W. DUDAS
*Director of the United States Patent and Trademark Office*